United States Patent
Kobayashi

(10) Patent No.: US 10,054,645 B2
(45) Date of Patent: Aug. 21, 2018

(54) DETERIORATION DETERMINATION METHOD, DETERIORATION DETERMINATION DEVICE, AND STORAGE MEDIUM

(71) Applicant: NEC Corporation, Tokyo (JP)

(72) Inventor: Kenji Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 194 days.

(21) Appl. No.: 14/766,022

(22) PCT Filed: Nov. 1, 2013

(86) PCT No.: PCT/JP2013/079729
§ 371 (c)(1),
(2) Date: Aug. 5, 2015

(87) PCT Pub. No.: WO2014/122831
PCT Pub. Date: Aug. 14, 2014

(65) Prior Publication Data
US 2015/0369876 A1    Dec. 24, 2015

(30) Foreign Application Priority Data
Feb. 6, 2013 (JP) .................. 2013-021653

(51) Int. Cl.
*G01R 31/28* (2006.01)
*G01R 31/36* (2006.01)
(Continued)

(52) U.S. Cl.
CPC ..... *G01R 31/3679* (2013.01); *G01R 31/3658* (2013.01); *H01M 10/04* (2013.01);
(Continued)

(58) Field of Classification Search
CPC ............... G01R 31/3679; H02J 7/0021; H02J 2007/005; Y10S 320/21; Y10T 29/49004; Y10T 29/49108
(Continued)

(56) References Cited

U.S. PATENT DOCUMENTS 7,554,330 B2 *  6/2009  Ashtiani ............ G01R 31/3679
                                                      320/132
8,255,176 B2 *  8/2012  Plestid .............. G01R 31/3679
                                                      320/128
2013/0090872 A1  4/2013  Kurimoto

FOREIGN PATENT DOCUMENTS

JP        6-38387       2/1994
JP       11-326471      11/1999
(Continued)

OTHER PUBLICATIONS

International Search Report dated Jan. 21, 2014 in corresponding PCT International Application.
(Continued)

*Primary Examiner* — Thiem Phan
(74) *Attorney, Agent, or Firm* — Finnegan, Henderson, Farabow, Garrett & Dunner, L.L.P.

(57) ABSTRACT

An object of the present invention is to accurately perform deterioration determination of a lithium ion secondary battery. In order to attain the object, in a deterioration determination method of the present invention, first, measurement processing of charging a deterioration determination target which is a battery cell or a battery module connecting a plurality of battery cells with each other up to a predetermined voltage value, discharging, and measuring a charge voltage value (a charge voltage value after the start of the discharge) within a predetermined period of time from the start of the discharge is repeated a plurality of times. Then, a deterioration state of the deterioration determination target (Continued)

is determined in consideration of a change mode of the charge voltage value after the start of the discharge due to the repetition of the charge and discharge.

7 Claims, 11 Drawing Sheets

(51) Int. Cl.
*H01M 10/04* (2006.01)
*H01M 10/058* (2010.01)
*H01M 10/48* (2006.01)
*H01M 10/0525* (2010.01)

(52) U.S. Cl.
CPC ....... *H01M 10/058* (2013.01); *H01M 10/482* (2013.01); *G01R 31/362* (2013.01); *H01M 10/0525* (2013.01); *Y10T 29/49004* (2015.01); *Y10T 29/49005* (2015.01)

(58) Field of Classification Search
USPC ................................ 29/593, 623.1, 729, 730
See application file for complete search history.

(56) References Cited

FOREIGN PATENT DOCUMENTS

| | | |
|---|---|---|
| JP | 2000-116019 | 4/2000 |
| JP | 3370047 | 1/2003 |
| JP | 2003-243048 | 8/2003 |
| JP | 2004-158264 | 6/2004 |
| JP | 2009-210494 | 9/2009 |
| JP | 2011-257314 | 12/2011 |
| WO | WO 2011/162014 A1 | 12/2011 |

OTHER PUBLICATIONS

Japanese Office Action dated Jun. 28, 2016, by the Japanese Patent Office in counterpart Japanese Patent Application No. 2014-560640.

* cited by examiner

DETERIORATION DETERMINATION METHOD, DETERIORATION DETERMINATION DEVICE, AND STORAGE MEDIUM

CROSS-REFERENCE TO RELATED PATENT APPLICATIONS

This application is a National Stage Entry of International Application No. PCT/JP2013/079729, filed Nov. 1, 2013, which claims priority from Japanese Patent Application No. 2013-021653, filed Feb. 6, 2013. The entire contents of the above-referenced applications are expressly incorporated herein by reference.

TECHNICAL FIELD

The present invention relates to a deterioration determination method, a manufacturing method of an electric storage device, a deterioration determination device, and a program.

BACKGROUND ART

A deterioration determination method of a lithium secondary battery is disclosed in Patent Document 1. In the deterioration determination method, an estimated capacity of the lithium ion battery is calculated from a voltage change during charge, and when the estimated capacity is smaller than a limit capacity which is set in advance, the lithium secondary battery is determined as being deteriorated.

RELATED DOCUMENT

Patent Document

[Patent Document 1] Japanese Patent No. 3370047

DISCLOSURE OF THE INVENTION

The present inventor has newly found the following problems. When a lithium ion secondary battery is stored (stands) in a state of not being used for a long period of time (in a state where charge and discharge excluding self-discharge are not performed), property deterioration temporarily progresses (a decrease in a battery capacity) compared to a state before being stored. In a case of a deterioration determination method which does not consider such conditions, it may be erroneously determined that the deterioration progresses up to a predetermined level set in advance due to the temporary property deterioration.

An object of the present invention is to provide a technology of accurately performing deterioration determination of a lithium ion secondary battery.

According to the present invention, there is provided a deterioration determination method including a deterioration determination step of repeating a plurality of times measurement processing of charging a deterioration determination target which is a battery cell or a battery module connecting a plurality of battery cells with each other up to a predetermined voltage value, discharging the deterioration determination target, and measuring a charge voltage value within a predetermined period of time from the start of the discharge, and after that, determining a deterioration state of the deterioration determination target in consideration of a change mode of the charge voltage value due to the repetition of the charge and discharge.

In addition, according to the present invention, there is provided a manufacturing method of an electric storage device including a determination step of performing deterioration determination with respect to a deterioration determination target which is a battery cell or a battery module connecting a plurality of battery cells with each other, by using the deterioration determination method described above; and a manufacturing step of manufacturing an electric storage device by using only the deterioration determination target which is determined as being acceptable in the determination step.

In addition, according to the present invention, there is provided a deterioration determination device including a maintaining unit maintaining a deterioration determination target which is a battery module connecting a plurality of battery cells with each other; and a determination unit repeating a plurality of times measurement processing of charging the deterioration determination target maintained in the maintaining unit up to a predetermined voltage value, discharging the deterioration determination target, and measuring a charge voltage value within a predetermined period of time from the start of the discharge, and after that, determining a deterioration state of the deterioration determination target in consideration of a change mode of the charge voltage value due to the repetition of the charge and discharge.

In addition, according to the present invention, there is provided a program for allowing a computer to function as a unit repeating a plurality of times measurement processing of charging a deterioration determination target which is a battery cell or a battery module connecting a plurality of battery cells with each other up to a predetermined voltage value, discharging the deterioration determination target, and measuring a charge voltage value within a predetermined period of time from the start of the discharge, and after that, determining a deterioration state of the deterioration determination target in consideration of a change mode of the charge voltage value due to the repetition of the charge and discharge.

According to the present invention, it is possible to accurately perform deterioration determination of a lithium ion secondary battery.

BRIEF DESCRIPTION OF THE DRAWINGS

The object described above, and other objects, characteristics, and advantages will become more obvious with reference to the following preferred exemplary embodiments and the following drawings attached thereto.

DESCRIPTION OF EXEMPLARY EMBODIMENTS

Figure 1:
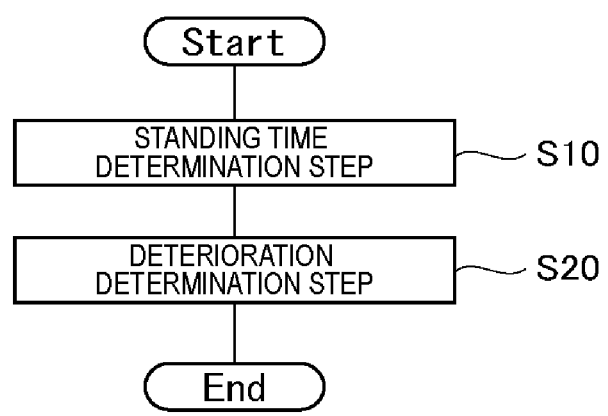
FIG. 1 is a flowchart illustrating an example of a processing flow of a deterioration determination method of an exemplary embodiment.

Hereinafter, exemplary embodiments of the present invention will be described with reference to the drawings. Furthermore, in a plurality of drawings, the same reference numerals are applied to the same constituent parts, and the description thereof will not be repeated.

Furthermore, a system and a device of this exemplary embodiment are realized by an arbitrary combination of hardware and software with a focus on a CPU, a memory, a program loaded on a memory (including a program downloaded from a memory medium such as a CD or a server or the like on the Internet in addition to a program which is stored in a memory in advance from a shipping stage of the device), a memory unit such as hard disk which stores the program, and an interface for network connection of an arbitrary computer. Then, a person skilled in the art will understand that a realization method and a device thereof include various modification examples.

In addition, a functional block diagram used for describing this exemplary embodiment does not illustrate a configuration of a hardware unit, but a block of a functional unit. In these drawings, it is described that each system and each device are realized by one instrument, but a realization unit thereof is not limited thereto. That is, each system and each device may be configured to be physically divided, or may be configured to be logically divided.

<First Exemplary Embodiment>

Figure 10:
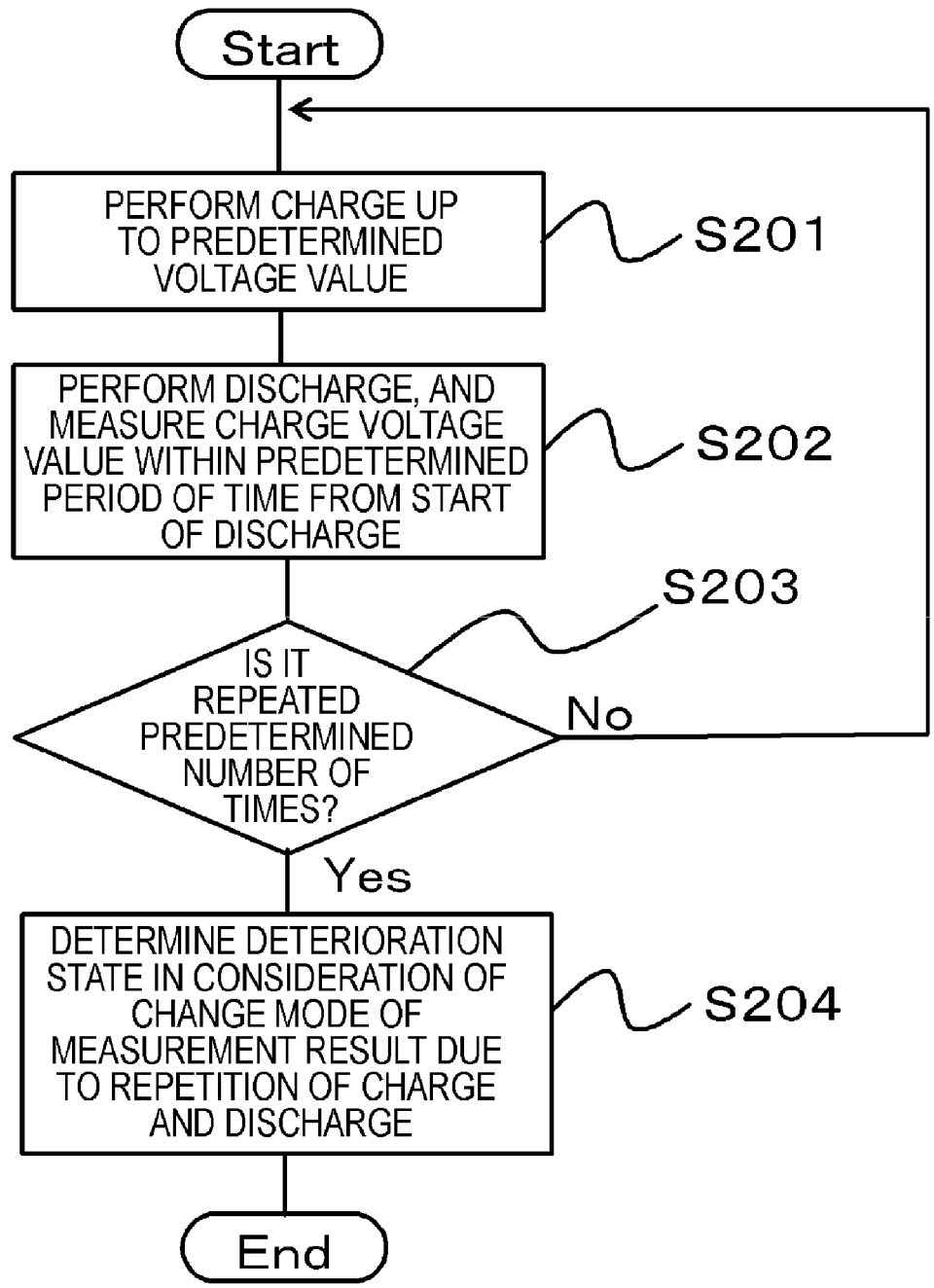
FIG. 10 is a flowchart illustrating an example of a processing flow of a deterioration determination method of an exemplary embodiment.

A deterioration determination method of this exemplary embodiment includes a deterioration determination step. FIG. 10 is a flowchart illustrating an example of a processing flow of the deterioration determination step. As illustrated, in the deterioration determination step, measurement processing of charging a deterioration determination target which is a battery module connecting a battery cell or a plurality of battery cells with each other up to a predetermined voltage value (Engineering expedient. Example: SOC is 100%) (S201), discharging (Engineering expedient. Example: the discharge is performed until SOC is less than or equal to 50%), and measuring a charge voltage value (hereinafter, referred to as a "charge voltage value after the start of the discharge") within a predetermined period of time (Engineering expedient. Example: approximately 1 minute to 2 minutes) from the start of the discharge (S202) is repeated a plurality of times (S203), and after that, a deterioration state of the deterioration determination target is determined in consideration of a change mode of the charge voltage value after the start of the discharge due to the repetition of the charge and discharge (S204). The discharge is able to be performed by being connected to a predetermined load. A measurement unit for measuring the charge voltage value after the start of the discharge is not particularly limited.

The present inventor has found that, when a lithium ion secondary battery is stored (stands) in a state of not being used for a long period of time (in a state where the charge and the discharge excluding self-discharge are not performed), a fact that property deterioration (a decrease in a battery capacity) temporarily progresses compared to a state before being stored and a state where the temporary property deterioration progresses are gradually recovered by the repetition of the charge and discharge (the degree of the property deterioration is recovered). It is considered that the temporary property deterioration is due to a fact that a lithium distribution in the battery is considerably different before and after being stored. In a case of a large-sized battery having a large battery area, in order to make the distribution in a steady state, a great deal of time is required compared to a case of a small-sized battery.

Furthermore, obviously, the property deterioration of the lithium ion secondary battery may actually progress due to some factors caused by the long-term storage (standing) for a long period of time. That is, property deterioration which is rarely recovered instead of temporary property deterioration may progress. For this reason, in the deterioration determination, it is necessary to discriminate these deterioration determination targets from each other, and to detect the deterioration determination target in which property deterioration actually progresses.

In this exemplary embodiment, the measurement processing in which the deterioration determination target is charged up to a predetermined voltage value, and then is discharged, and the charge voltage value after the start of the discharge is measured within a predetermined period of time from the start of the discharge is repeated a plurality of times. Then, the deterioration state of the deterioration determination target is determined in consideration of the change mode of the charge voltage value after the start of the discharge due to the repetition of the charge and discharge.

As described in the following examples, the present inventor has confirmed that the deterioration determination target kept in a state of not being used for a long period of time (in a state where the charge and the discharge excluding self-discharge are not performed) in which the property deterioration (a decrease in the battery capacity) temporarily progresses compared to a state before being kept has a charge voltage value after the start of the discharge which decreases compared to a value before being kept, similar to a case where the property deterioration actually progresses. In addition, the present inventor has confirmed that the deterioration determination target in which the property deterioration (a decrease in the battery capacity) temporarily progresses has a charge voltage value after the start of the discharge which is gradually recovered toward a value before being kept by the repetition of the charge and discharge. Further, the present inventor has confirmed that the deterioration determination target in which the property deterioration actually progresses does not have a charge voltage value after the start of the discharge which is recovered toward a value before being kept by the repetition of the charge and discharge, or the degree of the recovery is not sufficient.

When the deterioration state of the deterioration determination target is determined by using only a measurement result of one charge voltage value after the start of the discharge after being stored, the deterioration determination target in which the property deterioration actually progresses is not able to be definitely discriminated from the deterioration determination target in which the property deterioration temporarily progresses, but both of the deterioration determination targets may be determined as a rejected product in which the property deterioration progresses up to a predetermined level. That is, the deterioration determination target in which the property deterioration just temporarily progresses and which is originally an acceptable product may be erroneously determined as a rejected product.

In this exemplary embodiment, the deterioration state of the deterioration determination target is determined in consideration of the change mode of the charge voltage value after the start of the discharge due to the repetition of the charge and discharge, that is, the degree of the recovery. For this reason, it is possible to definitely discriminate the deterioration determination target in which the property deterioration actually progresses from the deterioration determination target in which the property deterioration temporarily progresses. As result thereof, it is possible to prevent the deterioration determination target in which the property deterioration just temporarily progresses and which is originally an acceptable product from being erroneously determined as a rejected product.

Furthermore, the deterioration determination target is a single lithium ion secondary battery cell or a battery module connecting a plurality of lithium ion secondary battery cells with each other in series and/or in parallel. The number of battery cells included in one battery module is not particularly limited. The deterioration determination target may be a battery cell or a battery module before being embedded in an electric storage device including a storage battery and a charge and discharge control device, or may be a battery cell or a battery module embedded in the electric storage device. In the former case, for example, a battery cell or a battery module which is stored for a definite period of time after being manufactured and before being embedded in the electric storage device is able to be the deterioration determination target. When the deterioration determination target is the battery module, the deterioration determination described above is able to be performed with respect to each battery cell. That is, it is possible to measure the charge voltage value after the start of the discharge for each battery cell, and to determine the deterioration state for each battery cell.

According to the deterioration determination method of this exemplary embodiment described above, it is possible to accurately perform deterioration determination of a lithium ion secondary battery.

<Second Exemplary Embodiment>

Figure 11:
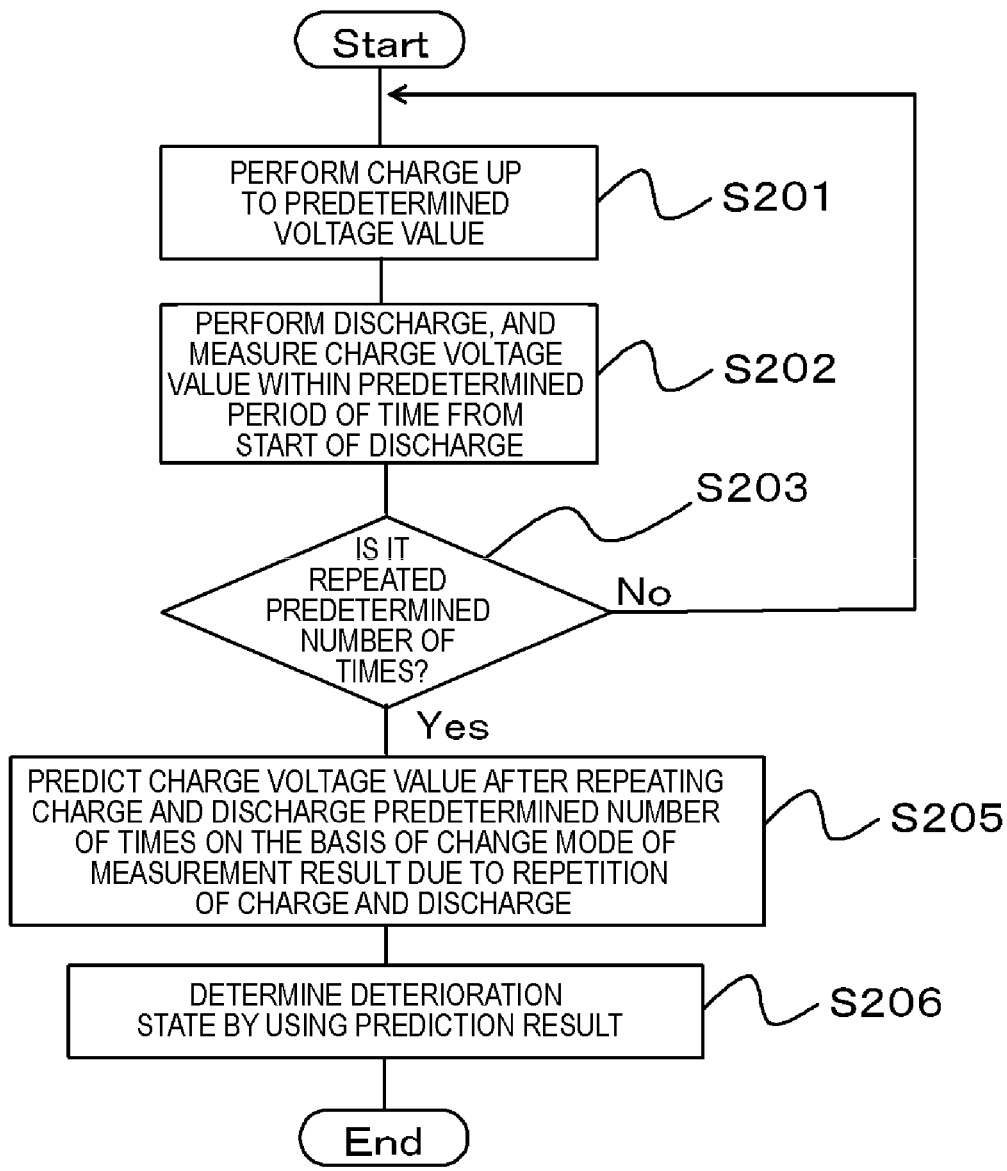
FIG. 11 is a flowchart illustrating an example of a processing flow of a deterioration determination method of an exemplary embodiment.

FIG. 11 is a flowchart illustrating an example of a processing flow of a deterioration determination step of this exemplary embodiment. S201 to S203 are identical to that of the first exemplary embodiment. The deterioration determination step of this exemplary embodiment is different from the first exemplary embodiment in that the processing of S204 in the first exemplary embodiment is more specified. The others are identical to those of the first exemplary embodiment.

That is, in the deterioration determination step of this exemplary embodiment, the charge and discharge and the measurement of the charge voltage value after the start of the discharge in a predetermined period of time are repeated a predetermined number of times (yes in S203), and then the charge voltage value after the start of the discharge after the charge and discharge is repeated a predetermined number of times is predicted on the basis of the change mode of the charge voltage value after the start of the discharge due to the repetition of the charge and discharge (S205). Then, the deterioration state of the deterioration determination target is determined on the basis of a comparison result between a prediction value and a first reference value which is maintained in advance (S206).

As described in the first exemplary embodiment, the temporary property deterioration appearing in the deterioration determination target after being stored for a long period of time is gradually recovered by the repetition of the charge and discharge. In this exemplary embodiment, the change mode of the charge voltage value after the start of the discharge due to the repetition of the charge and discharge is estimated by using a plurality of charge voltage values after the start of the discharge which is obtained by performing the charge and discharge and measuring the charge voltage value after the start of the discharge a plurality of times (Engineering expedient. Example: 3 times to 5 times). Then, the charge voltage value after the start of the discharge (a predicted recovery value) after repeating the charge and discharge a predetermined number of times (Engineering expedient. Example: 10 times) is estimated by using an estimation result thereof, and the deterioration state is determined on the basis of a comparison result between the estimation result (the predicted recovery value) and the first reference value set in advance. The estimation, for example, may be realized by applying least squares fitting to data of the charge voltage value after the start of the discharge by an exponential function having a linear monotonic decrease. Specifically, $V_0$ in $V(N)=V_0$ (a convergence value)$+A$ $(-N/B)$ (N: the number of times (hours), A: a constant, and B: a parameter depending on the state of the battery) is estimated, and the degree of the deterioration may be determined from a difference between the estimated $V_0$ and the first reference value.

The first reference value may be a value which is obtained by simulating the charge voltage value after the start of the discharge in the deterioration determination target before being stored, and may be an actual measured value, or may be a value determined by a simulation. For example, the deterioration determination target of which the predicted recovery value (a representative value among the predicted recovery values within a predetermined period of time from the start of the discharge) is greater than or equal to a predetermined ratio of the first reference value (Engineering expedient. Example: greater than or equal to 80%) may be determined as being acceptable.

Furthermore, the degree of the recovery, that is, the number of times of the repetition of charge and discharge for performing the recovery is a value which is changed according to the design (the size or the like) of the deterioration determination target. For this reason, the number of times of the repetition of the charge and discharge, the number of times which is reference for calculating the predicted recovery value, reference for determining whether or not the deterioration determination target is acceptable (the ratio described above or the like), and the like are engineering expedients which are determined on the basis of the design of each deterioration determination target.

According to this exemplary embodiment described above, the same functional effect as that of the first exemplary embodiment is able to be obtained.

In addition, it is possible to reduce the number of times of performing the charge and discharge and the measurement of the charge voltage value after the start of the discharge, and thus it is possible to improve processing efficiency.

<Third Exemplary Embodiment>

The deterioration determination method of this exemplary embodiment is different from the first exemplary embodiment and the second exemplary embodiment in that a standing time determination step is included before the deterioration determination step. The other configuration of the deterioration determination method of this exemplary embodiment is identical to that of the deterioration determination method of the first exemplary embodiment and the second exemplary embodiment.

FIG. 1 is a flowchart illustrating an example of a processing flow of the deterioration determination method of this exemplary embodiment.

A standing time determination step S10 is performed before a deterioration determination step S20. In the standing time determination step S10, it is determined that whether or not a standing time exceeds a predetermined period of time (a reference time) in a state where the deterioration determination target is not used.

The unused state is a state where the charge and the discharge excluding the self-discharge are not performed. The reference time is an engineering expedient which is able to be set by determining the degree of the influence of the standing time on the degree of the deterioration determination on the basis of the design for each deterioration determination target, and for example, may be greater than or equal to 72 hours.

In the deterioration determination step S20, when the standing time exceeds the reference time in the standing time determination step S10, the determination of the deterioration state is performed with respect to only the determined deterioration determination target. The detail of the determination of the deterioration state is as described in the first exemplary embodiment and the second exemplary embodiment.

The deterioration determination target in which the standing time does not exceed the reference time is able to be determined that actual property deterioration does not progress to that extent. The deterioration determination is not performed with respect to such a deterioration determination target, but the deterioration determination is performed with respect to only the deterioration determination target in which the standing time exceeds the reference time, and thus it is possible to reduce the number of deterioration determination targets. As a result thereof, an excellent effect such as an improvement in working efficiency and a reduction in the cost is realized.

Furthermore, according to this exemplary embodiment, the same functional effect as that of the first exemplary embodiment and the second exemplary embodiment is able to be realized.

<Fourth Exemplary Embodiment>

A deterioration determination method of this exemplary embodiment is different from the first exemplary embodiment and the second exemplary embodiment in that a previous step deterioration determination step is included before the deterioration determination step. The other configuration of the deterioration determination method of this exemplary embodiment is identical to that of the deterioration determination method of the first exemplary embodiment and the second exemplary embodiment.

Figure 2:
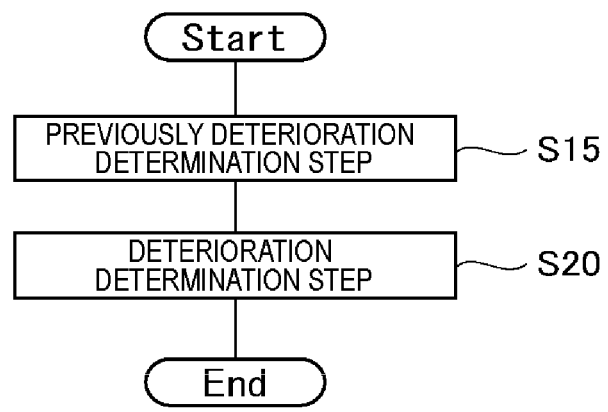
FIG. 2 is a flowchart illustrating an example of a processing flow of a deterioration determination method of an exemplary embodiment.

FIG. 2 is a flowchart illustrating an example of a processing flow of the deterioration determination method of this exemplary embodiment.

A previous step deterioration determination step S15 is performed before the deterioration determination step S20. In the previous step deterioration determination step S15, with respect to the deterioration determination target, the measurement processing of charging up to a predetermined voltage value (Engineering expedient. Example: SOC is 100%), discharging (Engineering expedient. Example: the discharge is performed until SOC is less than or equal to 50%), and measuring the charge voltage value within a predetermined period of time from the start of the discharge (Engineering expedient. Example: for approximately 1 minute to 2 minutes) is performed once, and after that, the deterioration state of the deterioration determination target is determined on the basis of a comparison result between the measurement value and a second reference value maintained in advance. The discharge is able to be performed by being connected to a predetermined load. A unit for measuring the charge voltage value after the start of the discharge is not particularly limited.

The second reference value may be a value which is obtained by simulating the charge voltage value after the start of the discharge in the deterioration determination target before being stored, and may be an actual measured value, or may be a value determined by a simulation. For example, the deterioration determination target of which the charge voltage value after the start of the discharge (the representative value among the measurement values) obtained by one measurement described above is greater than or equal to a predetermined ratio of the second reference value (Engineering expedient. Example: greater than or equal to 97%) may be determined as being acceptable.

In the deterioration determination step S20, the determination of the deterioration state is performed with respect to only the deterioration determination target in which the deterioration state determined in the previous step deterioration determination step S15 is not at an acceptable level set in advance. The detail of the determination of the deterioration state in the step described above is as described in the first exemplary embodiment and the second exemplary embodiment.

According to this exemplary embodiment, the deterioration determination target in which either the temporary property deterioration due to the storage (the deterioration which is recovered by the repetition of the charge and discharge) or the actual property deterioration (the deterioration which is not recovered by the repetition of the charge and discharge) does not progress up to a predetermined level is able to be excluded from the deterioration determination target of the deterioration determination step S20. Such a deterioration determination target is not required to be subjected to the deterioration determination step S20, and is able to be determined as an acceptable product. As a result thereof, an excellent effect such as an improvement in working efficiency and a reduction in the cost is realized.

Furthermore, according to this exemplary embodiment, the same functional effect as that in the first exemplary embodiment and the second exemplary embodiment is able to be realized.

<Fifth Exemplary Embodiment>

A deterioration determination method of this exemplary embodiment is different from the fourth exemplary embodiment in that the standing time determination step S10 is included before the previous step deterioration determination step S15. The other configuration of the deterioration determination method of this exemplary embodiment is identical to that of the deterioration determination method of the fourth exemplary embodiment.

Figure 3:
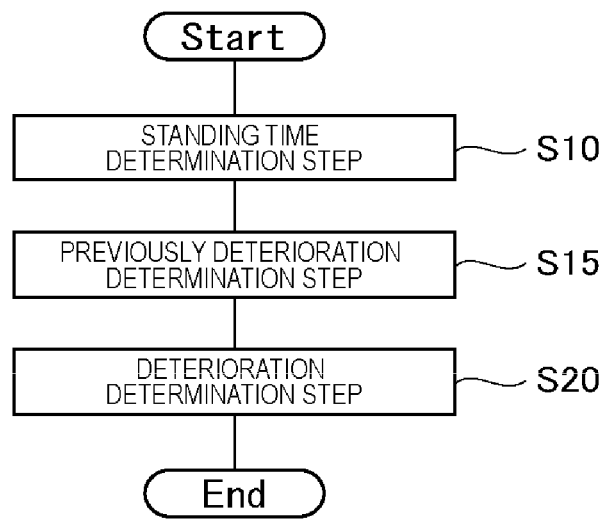
FIG. 3 is a flowchart illustrating an example of a processing flow of a deterioration determination method of an exemplary embodiment.

FIG. 3 is a flowchart illustrating an example of a processing flow of the deterioration determination method of this exemplary embodiment.

The standing time determination step S10 is performed before the previous step deterioration determination step S15. Furthermore, the deterioration determination step S20 is performed after the previous step deterioration determination step S15.

The standing time determination step S10 is as described in the third exemplary embodiment.

In the previous step deterioration determination step S15, the determination of the deterioration state is performed with respect to only the deterioration determination target in which it is determined that the standing time exceeds the reference time in the standing time determination step S10. The detail of the determination of the deterioration state in the step described above is as described in the second exemplary embodiment.

In the deterioration determination step S20, the determination of the deterioration state is performed with respect to only the deterioration determination target in which the deterioration state determined in the previous step deterioration determination step S15 is not at an acceptable level set in advance. The detail of the determination of the deterioration state in the step described above is as described in the first exemplary embodiment and the second exemplary embodiment.

The deterioration determination target in which the standing time does not exceed the reference time is able to be determined that the property deterioration does not progress. The deterioration determination is not performed with respect to such a deterioration determination target, but the deterioration determination is performed with respect to only the deterioration determination target in which the standing time exceeds the reference time, and thus it is possible to reduce the number of deterioration determination targets. As a result thereof, an excellent effect such as an improvement in working efficiency and a reduction in the cost is realized.

In addition, according to this exemplary embodiment, among the deterioration determination targets which are stored for a period of time exceeding the reference time, the deterioration determination target in which neither the temporary property deterioration due to the storage (the deterioration which is recovered by the repetition of the charge and discharge) nor the actual property deterioration (the deterioration which is not recovered by the repetition of the charge and discharge) progresses up to a predetermined level is able to be excluded from the deterioration determination targets of the deterioration determination step S20. As a result thereof, an excellent effect such as an improvement in working efficiency and a reduction in the cost is realized.

Furthermore, according to this exemplary embodiment, the same functional effect as that in the first exemplary embodiment and the second exemplary embodiment is able to be realized.

<Sixth Exemplary Embodiment>

In this exemplary embodiment, a specific example of the deterioration determination method of the fifth exemplary embodiment will be described.

Figure 4:
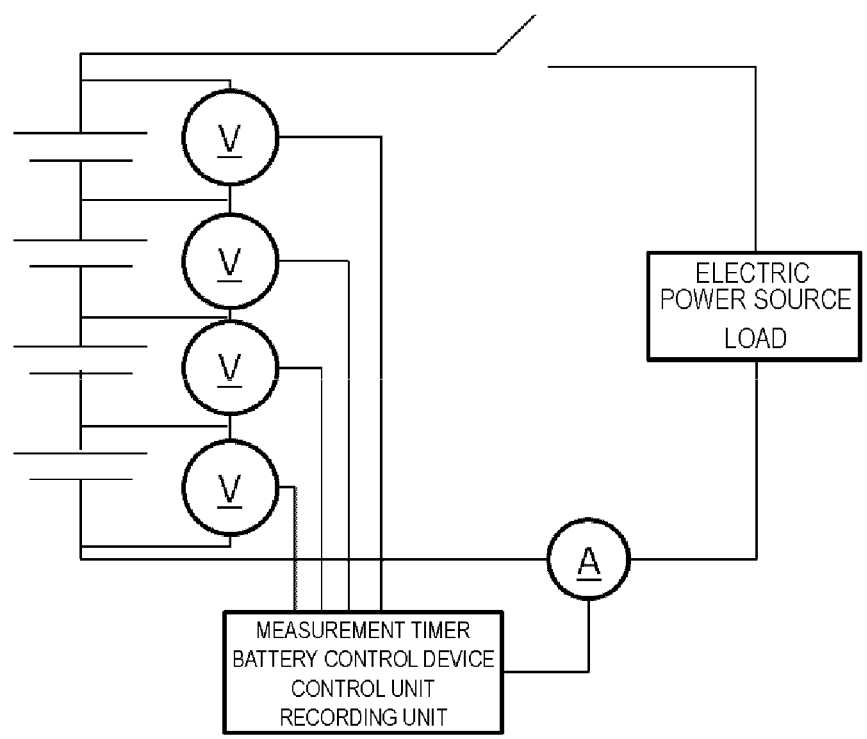
FIG. 4 is a diagram illustrating an example of a circuit diagram for measuring a deterioration determination target of an exemplary embodiment.

FIG. 4 is a diagram of an example of a circuit diagram for measuring a deterioration determination target of this exemplary embodiment. A battery unit including a battery cell or a battery module which is the deterioration determination target, an electric power source and a load device unit (in the drawing, indicated as an "electric power source load") for performing the charge and discharge with respect to the battery unit described above, and a recording unit recording a measurement result of a voltage and a current of the battery cell or the battery module are illustrated.

In FIG. 4, the battery unit is illustrated as a module in which four cells are connected in series, but the number of connected cells is not limited, and the battery unit may be a plurality of parallel circuits or a module configured of a plurality of parallel cells. In addition, the battery unit may be substituted by a single cell.

Here, the recording unit may be embedded in the battery unit, or may be an external instrument.

In addition, the battery unit and the load, and the external instruments are electrically openable and closable by a relay or the like.

Figure 5:
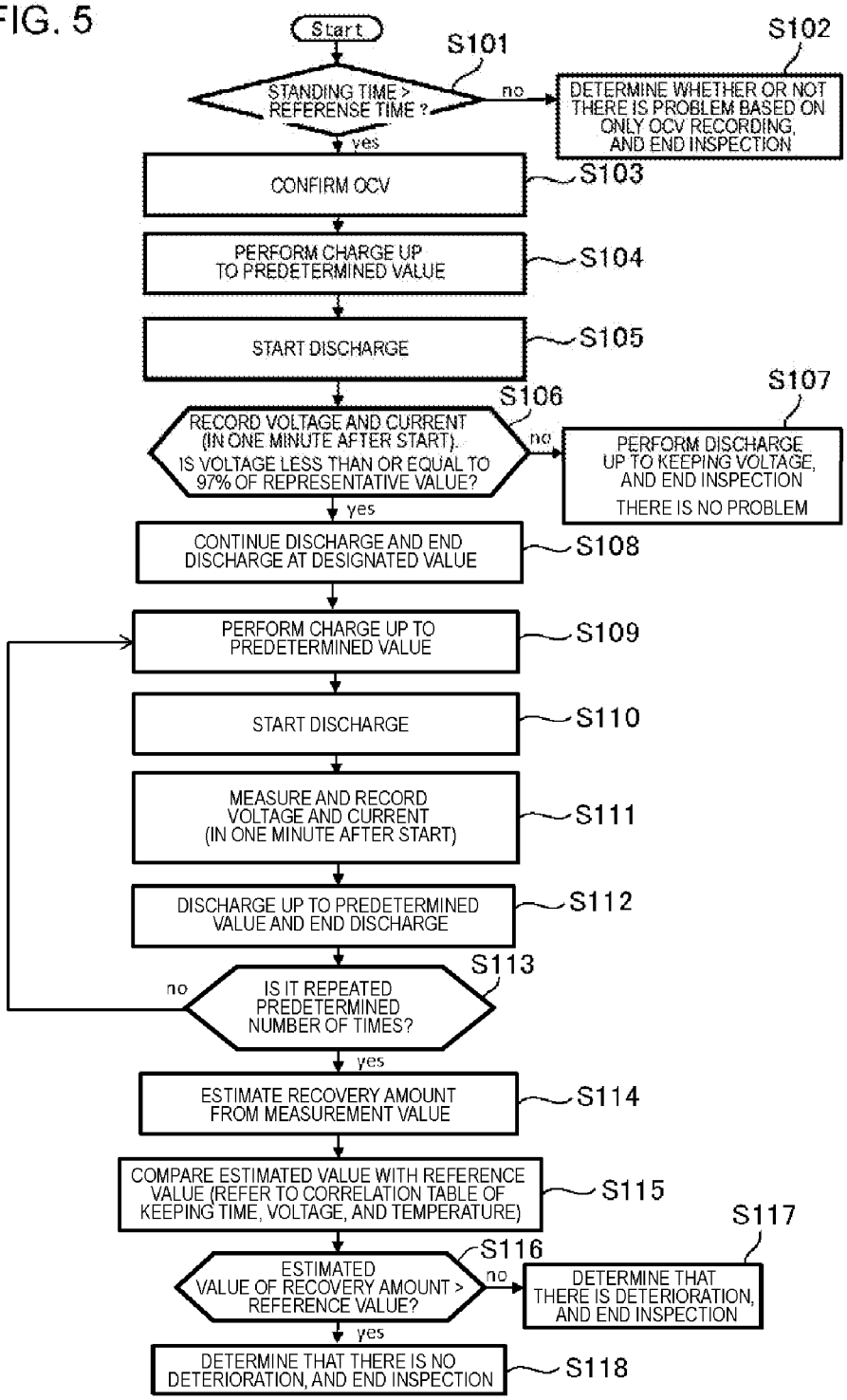
FIG. 5 is a flowchart illustrating an example of a processing flow of a deterioration determination method of an exemplary embodiment.

FIG. 5 is a flowchart illustrating an example of a processing flow of the deterioration determination method of this exemplary embodiment.

First, it is determined whether or not the standing time exceeds a predetermined period of time (the reference time) in a state of not using the deterioration determination target (S101. The standing time determination step). Here, the reference time is 72 hours. Though it is preferable that the reference time is greater than or equal to 72 hours, it is not particularly limited because the reference time depends on the capacity, the area, and the configuration material of the cell.

In S101, when it is determined that the standing time does not exceed the reference time (no in S101), it is determined that the deterioration level of the deterioration determination target is at an acceptable level (no problem), only an open circuit voltage of the deterioration determination target is recorded, and the inspection is ended (S102).

In contrast, in S101, when it is determined that the standing time exceeds the reference time (yes in S101), the open circuit voltage of the deterioration determination target is confirmed and recorded (S103), and then the process proceeds to the previous step deterioration determination step.

That is, the electric power source load is driven, and the deterioration determination target is charged up to a predetermined voltage value (Engineering expedient. Example: SOC is 100%) (S104), and then the discharge of the deterioration determination target is started through the electric power source load (S105), and the charge voltage value (the charge voltage value after the start of the discharge) of the deterioration determination target within a predetermined period of time (Engineering expedient. Example: 1 minute to 2 minutes) from the start of the discharge is measured. The predetermined period of time is measured by a measurement timer. After that, the deterioration state of the deterioration determination target is determined on the basis of a comparison result between the measurement value (the representative value among the measured charge voltage values after the start of the discharge) and the second reference value maintained in advance. Here, the second reference value is the representative value of the charge voltage value after the start of the discharge in the deterioration determination target before being stored (before standing). In addition, the acceptable level is a value of greater than or equal to 97% of the representative value of the charge voltage value after the start of the discharge in the deterioration determination target.

In S106, when it is determined that the deterioration level of the deterioration determination target is at the acceptable level (no in S106), the deterioration level of the deterioration determination target is determined as the acceptable level (no problem), the deterioration determination target is discharged up to a predetermined voltage suitable for the storage, and then the inspection is ended (S107).

In contrast, in S106, when it is determined that the deterioration level of the deterioration determination target is not at the acceptable level (yes in S106), the process proceeds to the deterioration determination step. That is, the deterioration determination target is discharged up to a predetermined voltage value (Engineering expedient. Example: SOC is less than or equal to 50%) (S108), and the deterioration determination target is charged again up to a predetermined voltage value (Engineering expedient. Example: SOC is 100%) (S109). Subsequently, the discharge of the deterioration determination target is started through the electric power source load (S110), and the charge voltage value (the charge voltage value after the start of the discharge) of the deterioration determination target within a predetermined period of time (Engineering expedient. Example: 1 minute to 2 minutes) from the start of the discharge is measured (S111). After that, the deterioration determination target is discharged up to a predetermined voltage value (Engineering expedient. Example: SOC is less than or equal to 50%) (S112).

A cycle from S109 to S112 is repeated a predetermined number of times (Engineering expedient. Example: 3 times to 5 times) (S113), and then a recovery amount due to the repetition of the charge and discharge is estimated from a change in a cell voltage (S114). As an estimation method, it is preferable to apply least squares fitting to data within one minute after the start of the discharge by an exponential function having a linear monotonic decrease. Here, the charge voltage value after the start of the discharge after repeating the charge and discharge 10 times is estimated. After that, the estimated value is compared with the first reference value (S115). The first reference value may be determined on the basis of a storage time, a storage temperature, a charge voltage value at the time of ending the charge, and the like. That is, the first reference value may be determined by preparing an arithmetic equation or a table for calculating the first reference value from these values in advance, and by using the equation or the table.

As a result of the determination in S115, when the estimated value at the tenth charge and discharge is included in a predetermined value (Engineering expedient. Example: a value greater than or equal to 80% of the first reference value) (yes in S116), it is determined that there is no deterioration, and the inspection is ended (S118). In contrast, when the estimated value at the tenth charge and discharge is not included in a predetermined value (no in S116), it is determined that there is deterioration, and the inspection is ended (S117).

According to this exemplary embodiment, the same functional effect as that of the first exemplary embodiment to the fifth exemplary embodiment is able to be obtained.

<Seventh Exemplary Embodiment>

In this exemplary embodiment, a deterioration determination device performing the deterioration determination method described in the first exemplary embodiment to the sixth exemplary embodiment will be described.

Figure 6:
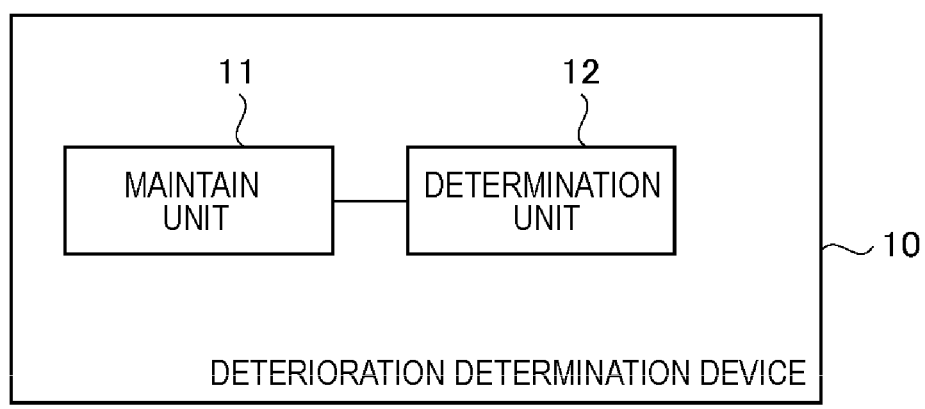
FIG. 6 is a diagram illustrating an example of a functional block diagram of a deterioration determination device of an exemplary embodiment.

In FIG. 6, an example of a functional block diagram of the deterioration determination device of this exemplary embodiment is illustrated. As illustrated, a deterioration determination device 10 of this exemplary embodiment includes a maintaining unit 11 and a determination unit 12.

The maintaining unit 11 is configured to maintain the deterioration determination target which is a battery cell or a battery module connecting a plurality of battery cells with each other. The configuration of the maintaining unit 11 is not particularly limited, and the maintaining unit 11 may be a pedestal for mounting the deterioration determination target thereon, may include an immobilization unit immobilizing the deterioration determination target such that the deterioration determination target is not moved, in addition to the pedestal, or may be a storage case accommodating the deterioration determination target. The configuration of the maintaining unit 11 is not limited to these examples. Furthermore, the maintaining unit 11 maintains the deterioration determination target in a mode where the deterioration determination target is able to be connected to the electric power source, the load, the measurement device, and the like.

The determination unit 12 repeats a plurality of times the measurement processing of charging the deterioration determination target maintained in the maintaining unit 11 up to a predetermined voltage value, discharging the deterioration determination target, and measuring the charge voltage value (the charge voltage value after the start of the discharge) within a predetermined period of time from the start of the discharge, and after that, determines the deterioration state of the deterioration determination target in consideration of the change mode of the charge voltage value after the start of the discharge due to the repetition of the charge and discharge.

The determination unit 12 may predict the charge voltage value after the charge and discharge is repeated a predetermined number of times on the basis of the change mode of the charge voltage value after the start of the discharge due to the repetition of the charge and discharge, and may determine the deterioration state of each battery cell on the basis of the comparison result between the prediction value and the first reference value maintained in advance.

The detail of the processing by the determination unit 12 is identical to the deterioration determination steps described in the first exemplary embodiment to the sixth exemplary embodiment.

Furthermore, the deterioration determination device 10 may include a previous step deterioration determination unit (not illustrated).

The previous step deterioration determination unit performs once the measurement processing of charging the deterioration determination target up to a predetermined voltage value, discharging the deterioration determination target, and measuring the charge voltage value within a predetermined period of time from the start of the discharge, and after that, determines the deterioration state of the deterioration determination target on the basis of the comparison result between the measurement value and the second reference value maintained in advance. The detail of the processing by the previous step deterioration determination unit is identical to the previous step deterioration determination step described in the fourth exemplary embodiment to the sixth exemplary embodiment.

When the deterioration determination device 10 includes the previous step deterioration determination unit, the determination unit 12 determines the deterioration state of only the deterioration determination target in which the deterioration state determined by the previous step deterioration determination unit is not at an acceptable level set in advance.

According to this exemplary embodiment, the same functional effect as that of the first exemplary embodiment to the sixth exemplary embodiment is able to be obtained.

<Eighth Exemplary Embodiment>

In this exemplary embodiment, a manufacturing method of an electric storage device using the deterioration determination method described in the first exemplary embodiment to the sixth exemplary embodiment will be described.

Figure 7:
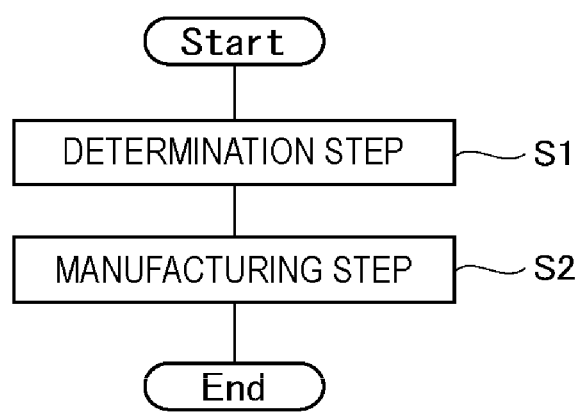
FIG. 7 is a flowchart illustrating an example of a processing flow of a manufacturing method of an electric storage device of an exemplary embodiment.

FIG. 7 is a flowchart illustrating an example of a processing flow of the manufacturing method of an electric storage device of this exemplary embodiment. The manufacturing method of an electric storage device of this exemplary embodiment includes a determination step S1 and a manufacturing step S2.

In the determination step S1, the deterioration determination is performed with respect to the deterioration determination target which is a battery cell or a battery module connecting a plurality of battery cell with each other by using the deterioration determination method described in the first exemplary embodiment to the sixth exemplary embodiment. For example, the determination step S1 is able to be performed with respect to the deterioration determination target which is stored (stands) for a definite period of time after being manufactured and before being embedded in the electric storage device, before the deterioration determination target is embedded in the electric storage device.

In the determination step S1, it is possible to determine the deterioration determination target in which the deterioration state determined in the deterioration determination step S20 is at an acceptable level set in advance as being acceptable.

In addition, in the determination step S1, it is possible to determine the deterioration determination target in which it is determined that the standing time does not exceed a predetermined period of time in the standing time determination step S10 as being acceptable.

Further, in the determination step S1, it is possible to determine the deterioration determination target in which the deterioration state determined in the previous step deterioration determination step S15 is at an acceptable level set in advance as being acceptable.

In the manufacturing step S2, the electric storage device is manufactured by using only the deterioration determination target which is determined as being acceptable in the determination step 1. The detail of the manufacturing step S2 is able to be based on the related art.

According to this exemplary embodiment described above, the electric storage device is able to be manufactured by using only the deterioration determination target which is determined as being acceptable in the deterioration determination, and thus sufficient quality assurance is obtained. In addition, it is possible to prevent the deterioration determination target in which the property deterioration temporarily progresses from being erroneously determined as being rejected, and thus it is possible to prevent an unnecessary cost increase.

EXAMPLE

Example 1

A 33 Ah cell was set as a deterioration determination target. The deterioration determination target was a laminated type and having A4-sized 30 sets of a positive electrode/a separator/a negative electrode which were laminated.

The deterioration determination target was subjected to aging processing and was discharged up to 3.0 V, and then was stored for 72 hours under an environment of room temperature. The charge and the discharge excluding self-discharge were not performed while the deterioration determination target is stored.

Figure 8:
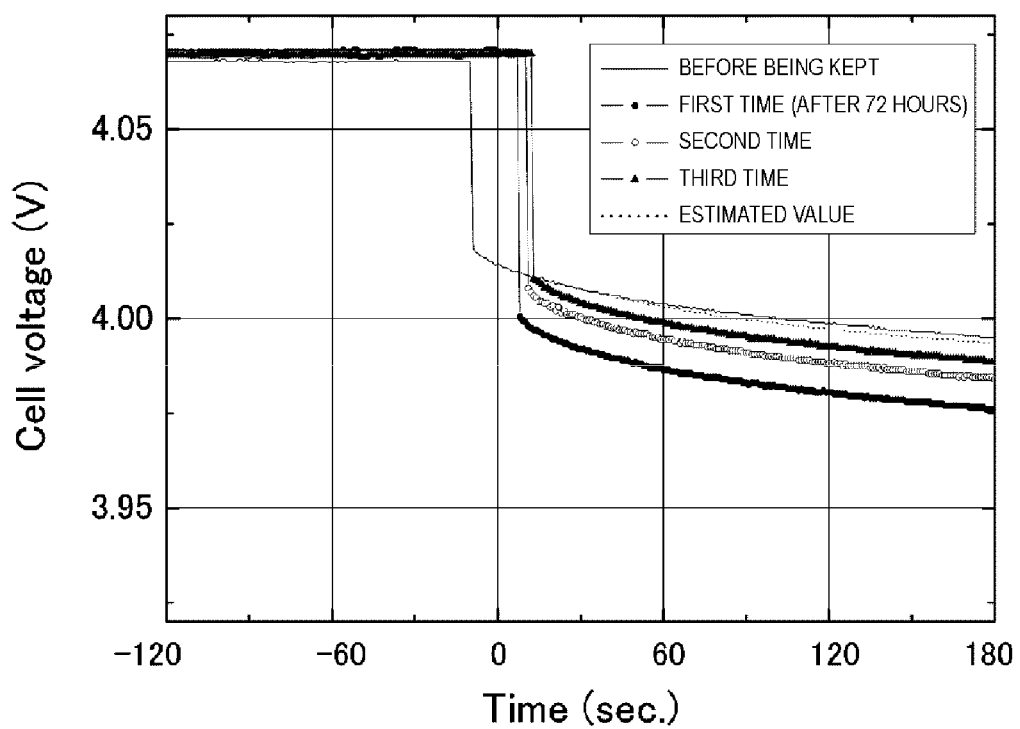
FIG. 8 is data illustrating results of examples.

After being stored, with respect to the deterioration determination target, the measurement processing of charging up to a predetermined voltage value, discharging, and measuring the charge voltage value (the charge voltage value after the start of the discharge) within a predetermined period of time from the start of the discharge was repeated a plurality of times. The measurement data is illustrated in FIG. 8. "First Time", "Second Time", and "Third Time" respectively indicate the charge voltage value after the start of the discharge after performing the charge and discharge each number of times. In FIG. 8, in addition, the charge voltage values after the start of the discharge (in the drawing, indicated as "before being stored") which are measured with respect to the deterioration determination target before being stored for 72 hours by using the same unit are illustrated.

From FIG. 8, it is found that a voltage decrease close to 20 mV occurs immediately after being stored for 72 hours (the first time), compared to a state before being stored. Then, it is found that the cell voltage is recovered by repeating the charge and discharge.

A broken line (the estimated value) in FIG. 8 indicates the charge voltage value after the start of the discharge immediately after the charge and discharge which is obtained by least square fitting the voltage in 1 minute after the start of the discharge is repeated 10 times. It was estimated that the recovery was performed up to a value close to the charge voltage value after the start of the discharge before being stored when the charge and discharge was repeated 10 times.

Furthermore, the charge voltage value after the start of the discharge which was measured after the charge and discharge was actually repeated 10 times was compared with the estimated value, and it was confirmed that the estimation was performed with sufficient accuracy.

Example 2

A 33 Ah cell was set as a deterioration determination target. The deterioration determination target was a laminated type, and having A4-sized 30 sets of a positive electrode/a separator/a negative electrode which were laminated.

The deterioration determination target was subjected to the aging processing and was discharged up to 3.0 V, and then was stored for 1 week under an environment of room temperature. The charge and the discharge excluding self-discharge were not performed while the deterioration determination target is stored.

Figure 9:
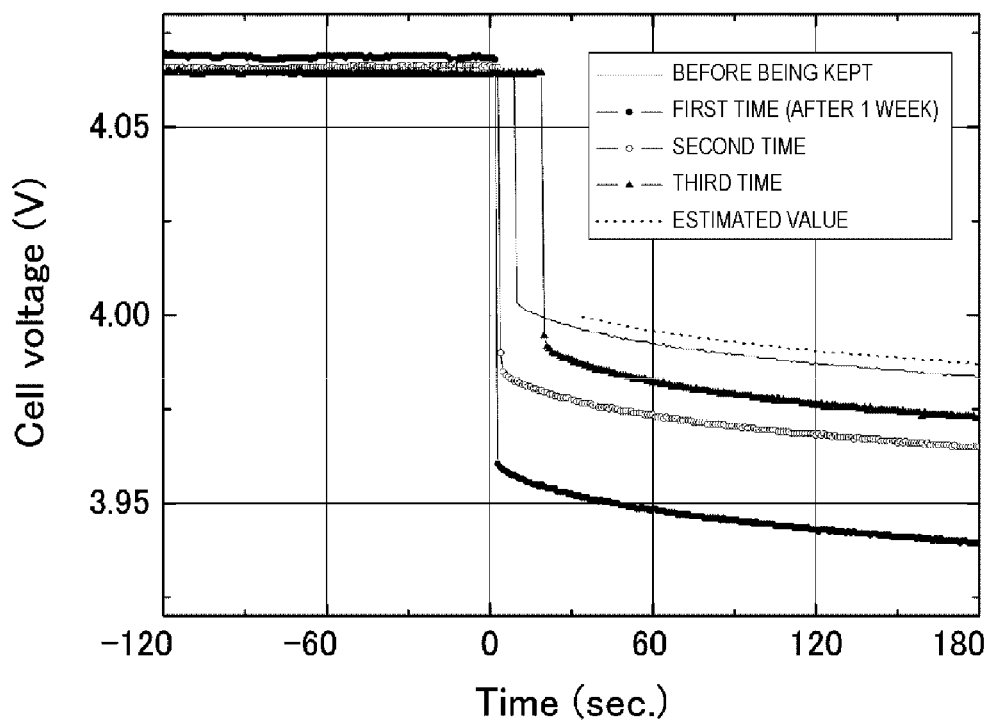
FIG. 9 is data illustrating results of examples.

After being stored, with respect to the deterioration determination target, the measurement processing of charging up to a predetermined voltage value, discharging, and measuring the charge voltage value (the charge voltage value after the start of the discharge) within a predetermined period of time from the start of the discharge was repeated a plurality of times. The measurement data is illustrated in FIG. 9. "First Time", "Second Time", and "Third Time" respectively indicate the charge voltage value after the start of the discharge after performing the charge and discharge each number of times. In FIG. 9, in addition, the charge voltage values after the start of the discharge (in the drawing, indicated as "before being stored") which are measured with respect to the deterioration determination target before being stored for 1 week by using the same unit are illustrated.

From FIG. 9, it is found that a voltage decrease close to 50 mV occurs immediately after being stored for 1 week (the first time), compared to a state before being stored. Then, it is found that the cell voltage is recovered by repeating the charge and discharge. In comparison with Example 1, it is found that the degree of the temporary property deterioration increases as a period of storage time becomes longer.

A broken line (the estimated value) in FIG. 9 indicates the charge voltage value after the start of the discharge immediately after the charge and discharge which is obtained by least square fitting the voltage in 1 minute after the start of the discharge is repeated 10 times. it was estimated that the recovery was performed up to a value close to the charge voltage value after the start of the discharge before being stored when the charge and discharge was repeated 10 times.

Furthermore, the charge voltage value after the start of the discharge which was measured after the charge and discharge was actually repeated 10 times was compared with the estimated value, and it was confirmed that the estimation was performed with sufficient accuracy.

<<Appendix>>

According to the above description, the present invention is described as follows.

<Appendix 1>

A deterioration determination method including a deterioration determination step of repeating a plurality of times measurement processing of charging a deterioration determination target which is a battery cell or a battery module connecting a plurality of battery cells with each other up to a predetermined voltage value, discharging the deterioration determination target, and measuring a charge voltage value within a predetermined period of time from the start of the discharge, and after that, determining a deterioration state of the deterioration determination target in consideration of a change mode of the charge voltage value due to the repetition of the charge and discharge.

<Appendix 2>

The deterioration determination method according to Appendix 1, in which in the deterioration determination step, the charge voltage value after repeating the charge and discharge a predetermined number of times is predicted on the basis of the change mode of the charge voltage value due to the repetition of the charge and discharge, and the deterioration state of the deterioration determination target is determined on the basis of a comparison result between a prediction value and a first reference value which is maintained in advance.

<Appendix 3>

The deterioration determination method according to Appendix 1 or 2 further including a standing time determination step of determining whether or not a period of time of standing in a state of not using the deterioration determination target exceeds a predetermined period of time, before the deterioration determination step, in which in the deterioration determination step, the determination of the deterioration state is performed with respect to only the deterioration determination target in which the standing time exceeds the predetermined period of time.

<Appendix 4>

The deterioration determination method according to Appendix 1 or 2 further including a previous step deterioration determination step of performing once the measurement processing of charging the deterioration determination target up to a predetermined voltage value, discharging the deterioration determination target, and measuring the charge voltage value within a predetermined period of time from the start of the discharge, and after that, determining the deterioration state of the deterioration determination target on the basis of a comparison result between a measurement value and a second reference value which is maintained in advance, before the deterioration determination step, in which in the deterioration determination step, the determination of the deterioration state is performed with respect to only the deterioration determination target in which the deterioration state determined in the previous step deterioration determination step is not at an acceptable level set in advance.

<Appendix 5>

The deterioration determination method according to Appendix 4 further including a standing time determination step of determining whether or not a period of time of standing in a state of not using the deterioration determination target exceeds a predetermined period of time, before the previous step deterioration determination step, in which in the previous step deterioration determination step, the determination of the deterioration state is performed with respect to only the deterioration determination target in which the standing time exceeds the predetermined period of time.

<Appendix 6>

The deterioration determination method according to any one of Appendixes 1 to 5, in which the battery cell is a lithium ion secondary battery cell.

<Appendix 7>

A manufacturing method of an electric storage device including a determination step of performing deterioration determination with respect to a deterioration determination target which is a battery module connecting a battery cell or a plurality of battery cells with each other, by using the deterioration determination method according to any one of Appendixes 1 to 6; and a manufacturing step of manufacturing an electric storage device by using only the deterioration determination target which is determined as being acceptable in the determination step.

<Appendix 8>

The manufacturing method of an electric storage device according to Appendix 7, in which in the determination step, the deterioration determination target in which a deterioration state determined in the deterioration determination step is at an acceptable level set in advance is determined as being acceptable.

<Appendix 9>

The manufacturing method of an electric storage device according to Appendix 8, in which in the determination step, the deterioration determination is performed by using the deterioration determination method according to Appendix 3 or Appendix 6 dependent on Appendix 3, and the deterioration determination target in which it is determined, in the standing time determination step, that the standing time does not exceed the predetermined period of time is further determined as being acceptable.

<Appendix 10>

The manufacturing method of an electric storage device according to Appendix 8, in which in the determination step, the deterioration determination is performed by using the deterioration determination method according to any one of Appendix 4, Appendix 5, or Appendix 6 dependent on Appendix 4 or Appendix 5, and in the previous step deterioration determination step, the deterioration determination target in which the determined deterioration state is at an acceptable level set in advance is further determined as being acceptable.

<Appendix 11>

The manufacturing method of an electric storage device according to Appendix 10, in which in the determination step, the deterioration determination is performed by using the deterioration determination method according to Appendix 5 or Appendix 6 dependent on Appendix 5, and the deterioration determination target in which it is determined, in the standing time determination step, that the standing time does not exceed the predetermined period of time is further determined as being acceptable.

<Appendix 12>

A deterioration determination device including a maintaining unit maintaining a deterioration determination target which is a battery cell or a battery module connecting a plurality of battery cells with each other; and a determination unit which repeats a plurality of times measurement processing of charging the deterioration determination target maintained in the maintaining unit up to a predetermined voltage value, discharging the deterioration determination target, and measuring a charge voltage value within a predetermined period of time from the start of the discharge, and after that, determines a deterioration state of the deterioration determination target in consideration of a change mode of the charge voltage value due to the repetition of the charge and discharge.

<Appendix 13>

The deterioration determination device according to Appendix 12, in which the determination unit predicts the charge voltage value after repeating the charge and discharge a predetermined number of times on the basis of the change mode of the charge voltage value due to the repetition of the charge and discharge, and determines the deterioration state of the deterioration determination target on the basis of a comparison result between a prediction value and a first reference value which is maintained in advance.

<Appendix 14>

The deterioration determination device according to Appendix 12 or 13 further including a previous step deterioration determination unit performing once the measurement processing of charging the deterioration determination target up to a predetermined voltage value, discharging the deterioration determination target, and measuring the charge voltage value within a predetermined period of time from the start of the discharge, and after that, determining the deterioration state of the deterioration determination target on the basis of a comparison result between a measurement value and a second reference value which is maintained in advance, in which the determination unit performs the determination of the deterioration state with respect to only the deterioration determination target in which the deterioration state determined by the previous step deterioration determination unit is not at an acceptable level set in advance.

<Appendix 15>

The deterioration determination device according to any one of Appendixes 12 to 14, in which the battery cell is a lithium ion secondary battery cell.

<Appendix 16>

A program for allowing a computer to function as a determination unit repeating a plurality of times measurement processing of charging a deterioration determination target which is a battery cell or a battery module connecting a plurality of battery cells with each other up to a predetermined voltage value, discharging the deterioration determination target, and measuring a charge voltage value within a predetermined period of time from the start of the discharge, and after that, determining a deterioration state of the deterioration determination target in consideration of a change mode of the charge voltage value due to the repetition of the charge and discharge.

<Appendix 16-2>

The program according to Appendix 16, in which the determination unit predicts the charge voltage value after repeating the charge and discharge a predetermined number of times on the basis of the change mode of the charge voltage value due to the repetition of the charge and discharge, and determines the deterioration state of the deterioration determination target on the basis of a comparison result between a prediction value and a first reference value which is maintained in advance.

<Appendix 16-3>

The program according to Appendix 16 or 16-2 further allowing the computer to function as a previous step deterioration determination unit which performs once the measurement processing of charging the deterioration determination target up to a predetermined voltage value, discharging the deterioration determination target, and measuring the charge voltage value within a predetermined period of time from the start of the discharge, and after that, determining the deterioration state of the deterioration determination target on the basis of a comparison result between a measurement value and a second reference value which is maintained in advance, in which the determination unit performs the determination of the deterioration state with respect to only the deterioration determination target in which the deterioration state determined by the previous step deterioration determination unit is not at an acceptable level set in advance.

<Appendix 16-4>

The program according to any one of Appendixes 16 to 16-3, in which the battery cell is a lithium ion secondary battery cell.

This application claims priority on the basis of Japanese Patent Application No. 2013-021653, filed on Feb. 6, 2013, and the entire disclosure thereof is incorporated herein.

The invention claimed is:

1. A deterioration determination method, comprising:
repeating, a plurality of times, measurement processing of a deterioration determination target comprising a battery cell or a battery module connecting a plurality of battery cells with each other, wherein the measurement processing includes charging the deterioration determination target up to a predetermined voltage value, discharging the deterioration determination target, and measuring a charge voltage value within a predetermined period of time from the start of the discharge; and
determining, after the measurement processing, a deterioration state of the deterioration determination target based on a degree of increase of the charge voltage value due to the repetition of the charging and discharging.

2. A deterioration determination device, comprising:
at least one processor configured to execute machine-readable instructions to implement:
a maintaining unit configured to maintain a deterioration determination target comprising a battery cell or a battery module connecting a plurality of battery cells with each other; and
a determination unit configured to:
repeat, a plurality of times, measurement processing of the deterioration determination target maintained in the maintaining unit, wherein the measurement processing includes charging the deterioration determination target up to a predetermined voltage value, discharging the deterioration determination target, and measuring a charge voltage value within a predetermined period of time from the start of the discharge; and
determine, after the measurement processing, a deterioration state of the deterioration determination target based on a degree of increase of the charge voltage value due to the repetition of the charging and discharging.

3. The deterioration determination device according to claim 2,
wherein the determination unit is configured to predict the charge voltage value after repeating the charge and discharge a predetermined number of times on the basis of the degree of increase of the charge voltage value due to the repetition of the charging and discharging, and to determine the deterioration state of the deterioration determination target on the basis of a comparison result between a prediction value and a first reference value which is maintained in advance.

4. The deterioration determination device according to claim 2, wherein the at least one processor is further configured to execute the machine-readable instructions to implement:
a previous step deterioration determination unit configured to determine the deterioration state of the deterioration determination target on the basis of a comparison result between a measurement value and a second reference value which is maintained in advance,
wherein the determination unit is configured to determine the deterioration state with respect to only the deterioration determination target in which the deterioration state determined by the previous step deterioration determination unit is not at an acceptable level set in advance.

5. The deterioration determination device according to claim 2,
wherein the battery cell is a lithium ion secondary battery cell.

6. A non-transitory storage medium storing computer-readable instructions that, when executed by a computer, cause the computer perform a method, comprising:
repeating, a plurality of times, measurement processing of a deterioration determination target comprising a battery cell or a battery module connecting a plurality of battery cells with each other, wherein the measurement processing includes charging the deterioration determination target up to a predetermined voltage value, discharging the deterioration determination target, and measuring a charge voltage value within a predetermined period of time from the start of the discharge; and
determining, after the measurement processing, a deterioration state of the deterioration determination target based on a degree of increase of the charge voltage value due to the repetition of the charging and discharging.

7. A deterioration determination device, comprising:
at least one processor configured to execute machine-readable instructions to implement:
a maintaining unit configured to maintain a deterioration determination target comprising a battery cell or a battery module connecting a plurality of battery cells with each other; and
a determination unit configured to:
determine a deterioration state of the deterioration determination target; and
perform processing of charging the deterioration determination target up to a predetermined voltage value, discharging the deterioration determination target, and measuring a charge voltage value within a predetermined period of time from the start of the discharge, and
when the measured charge voltage value is equal to or greater than a reference value, determine the deterioration determination target to be normal,
when the measured value is less than the reference value, repeat the processing a plurality of times, and
when an increased level of the measured value accompanying the repeated processing is equal to or greater than a reference level, determine the deterioration determination target to be normal, and
when the measured value is less than the reference value and the increased level of the measured value accompanying the repeated processing is less than the reference level, determine the deterioration determination target to be abnormal.

* * * * *